(12) United States Patent  
Wiederhold et al.

(10) Patent No.: US 8,963,503 B2  
(45) Date of Patent: Feb. 24, 2015

(54) SAFETY DISCHARGE APPARATUS FOR AN ELECTRICAL STORAGE ELEMENT

(75) Inventors: Thomas Wiederhold, Knuellwald (DE); Eberhard Janssen, Kassel (DE); Peter Baer, Mossautal (DE)

(73) Assignee: SMA Solar Technology AG, Niestetal (DE)

( * ) Notice: Subject to any disclaimer, the term of this patent is extended or adjusted under 35 U.S.C. 154(b) by 509 days.

(21) Appl. No.: 13/336,112

(22) Filed: Dec. 23, 2011

(65) Prior Publication Data

US 2012/0162839 A1    Jun. 28, 2012

(30) Foreign Application Priority Data

Dec. 23, 2010  (DE) .......................... 10 2010 061 537

(51) Int. Cl.
  *H02J 7/00*  (2006.01)
  *G01R 31/36*  (2006.01)
  *G01R 31/02*  (2006.01)

(52) U.S. Cl.
  CPC .......... *G01R 31/3631* (2013.01); *G01R 31/028* (2013.01)
  USPC ....................................................... 320/134

(58) Field of Classification Search
  USPC ........................................ 320/167, 134–136
  See application file for complete search history.

(56) References Cited

U.S. PATENT DOCUMENTS 7,019,416 B2 *    3/2006    Sasaki ............................. 307/43

FOREIGN PATENT DOCUMENTS

| DE | 19513441 A1 | 10/1996 |
| DE | 10261118 A1 | 7/2003 |
| WO | 03058792 A1 | 7/2003 |

OTHER PUBLICATIONS

Battery Charging and Discharging Circuit for Portable Devices. vol. 37. Jun. 1994. No. 06A. 609-610. IBM Technical Disclosure Bulletin [online]. 2 Pages.

* cited by examiner

*Primary Examiner* — Richard V Muralidar  
(74) *Attorney, Agent, or Firm* — Eschweiler & Associates, LLC (57) ABSTRACT

A safety discharge apparatus for an electrical storage element includes a load device for discharging the electrical storage element connected to the safety discharge apparatus via input connections. The apparatus includes a clocked switching device connected to a control device that serves to produce and interrupt a discharge current via the load device and the storage element, and a voltage detection device that detects a storage voltage of the electrical storage element to be discharged. The voltage detection device is connected to a discharge condition monitor that checks a dischargeability of the electrical storage element. An operating method for a safety discharge apparatus is also disclosed.

24 Claims, 4 Drawing Sheets

SAFETY DISCHARGE APPARATUS FOR AN ELECTRICAL STORAGE ELEMENT

REFERENCE TO RELATED APPLICATIONS

This application claims priority to German patent application DE 10 2010 061 537.4, filed on Dec. 23, 2010, the contents of which are hereby incorporated by reference in its entirety.

FIELD

The invention relates to a safety discharge apparatus for an electrical storage element, in particular a capacitor. The invention also relates to an operating method for such a safety discharge apparatus.

BACKGROUND

Electrical storage elements are, for example, capacitors or else rechargeable batteries. In particular, capacitors are used as storage elements in so-called intermediate circuits of e.g. inverters. In this case, they can have high charge capacitances (e.g. 5 mF) and/or high voltages (e.g. 1000 V). For the exchange and maintenance thereof, therefore, it is necessary to discharge these electrical storage elements safely.

Discharge apparatuses are known from consumer electronics, but said discharge apparatuses are not suitable on account of the low charge capacitances that occur there. Discharge apparatuses for motor vehicle batteries likewise cannot be used on account of their slowness.

So-called "kludges" are often used as well, in particular simple power resistors, which, for discharging an electrical storage element, are connected directly to the latter, e.g. to a capacitor. However, said power resistors on the one hand have to be designed for the high powers that occur (high weight and corresponding size), and on the other hand can heat up greatly or explode, particularly if the current feed to the electrical storage element to be discharged was not interrupted (e.g. in the case of a non-disconnected photovoltaic (PV) generator at the intermediate circuit of an inverter) and a continuously high current therefore flows through this bridging load resistor. Moreover, current accidents can occur, if, if appropriate, insulations melt as a result of high heating and voltage-carrying conductors become touchable.

The patent specification DE 195 13 441 C5 describes a circuit arrangement for testing electrical operating equipment, in particular a power cable with a high internal capacitance. The circuit arrangement is designed to supply a varying voltage to a test specimen according to a given voltage vs. time curve. For this purpose, the circuit arrangement comprises two variable DC power sources for providing a positive and a negative voltage, respectively. Furthermore, a controlled electronic high-voltage switch and a load resistor connected in series with the switch are provided for discharging the internal capacitance of the specimen. The interaction of the DC power sources for charging the internal capacitance of the specimen and of the electronic high-voltage switch for discharging the specimen allows for an accurate tracing of the given voltage vs. time curve.

IBM Technical Disclosure Bulletin, Vol. 37, No. 06A, June 1984, discloses an electronic circuit for monitoring the temperature of a battery within a device and for adjusting the charge and discharge rates according to the measured temperature. That way, maximum utilization of the device is provided while maintaining safe conditions at the battery.

Patent application DE 102 61 118 A1 discloses a battery charger that applies short intermediate discharge cycles at regular intervals to a battery while charging it. The intermediate discharge cycles remove depositions from electrodes of the battery, thereby increasing the lifetime of the battery.

SUMMARY

In one embodiment of the present invention an improved safety discharge apparatus for an electrical storage element is provided that provides a safe discharge, particularly if a current feed to the electrical storage element to be discharged is not interrupted. An operating method for such a safety discharge apparatus is also disclosed.

One embodiment of the invention provides a safety discharge apparatus for an electrical storage element, in particular a capacitor, comprising a load device for discharging the electrical storage element which is to be discharged and which can be connected to the safety discharge apparatus via input connections, and a clocked switching device connected to a control device and serving to produce and interrupt a discharge current via the load device and the storage element. The safety discharge apparatus further comprises a voltage detection device for detecting a storage voltage of the electrical storage element, wherein the voltage detection device is connected to means for checking a dischargeability of the electrical storage element.

A safety discharge apparatus comprising two input connections for discharging an electrical storage element is thus provided. By means of the voltage detection device, it is possible to monitor the storage voltage of the electrical storage element during the discharge process, wherein e.g. on the basis of its temporal profile, in particular in the short term, it is possible to identify whether or not the electrical storage element is dischargeable.

Furthermore, in one embodiment provision is made for a signalling device for indicating the status of the safety discharge apparatus. The signalling device achieves a high degree of safety in the handling of the safety discharge apparatus by an operator, since further incorrect operations can be avoided e.g. by fault identification and indication.

The term "storage voltage" should be understood to mean the voltage that can be measured at the terminals of the electrical storage component to be discharged.

A discharge process has at least one discharge cycle. A discharge cycle comprises a first time segment, in which the electrical storage element to be discharged is discharged via the load device, and a second time segment, in which the electrical storage element to be discharged is not discharged. Alternatively, a discharge cycle can also comprise a plurality of partial discharge cycles, i.e. of a plurality of successive cycles with the described time segments in a fixed or else variable clock ratio.

In one embodiment a protection device is arranged between the input connections and the load device for example as polarity reversal protection and/or arc protection. Simple and safe handling is thus possible. It is not necessary to laboriously determine e.g. a poorly visible or no longer discernable polarity marking. The arc protection allows safe handling at high voltages.

In one embodiment the voltage detection device is connected via a comparison device to the switching device for switching off the latter at a predetermined voltage. Thus, upon detection of "not discharge-typical" time profiles of the measured values of the storage voltage, a rapid turn-off of the safety discharge apparatus or a blocking thereof is safely possible. A "not discharge-typical" time profile is, for example, a storage voltage that is substantially stable, does not vary, or rises again in the time segments in which discharge is not effected.

At least one temperature monitoring device is provided in one embodiment for monitoring at least one temperature of the load device. Said device can also furthermore be provided for monitoring a temperature of the switching device. These temperatures can thus be monitored during a discharge process. It is likewise possible, if these temperatures have "not discharge-typical" time profiles, for the safety discharge apparatus to be turned off or blocked. A "not discharge-typical" time profile of a temperature is, for example, a rapid rise in temperature within a time segment in which a slow rise in temperature should normally be expected.

In one embodiment, provision is made of a voltage supply device for supplying the safety discharge apparatus with electrical energy from the electrical energy stored in the electrical storage element which is to be discharged and which can be connected to the safety discharge apparatus. As a result, it is possible to start the discharge process immediately upon connection to the electrical storage element to be discharged. Upon this start, a storage voltage measurement is immediately carried out with the corresponding safety conditions for turn-off, if for example an excessively high voltage not permissible for the safety discharge apparatus is detected as the storage voltage.

Furthermore, in one embodiment the safety discharge apparatus includes a cooling device for cooling the load device and/or the switching device. This can be cooling ribs and/or cooling systems e.g. by means of forced convection and/or a sufficient thermal mass.

The signalling device in one embodiment is furthermore to indicate the charge state of the electrical storage element which can be connected to the safety discharge apparatus. This therefore indicates to the operator not only the correctness of the profile of the discharge process but also the state of the electrical storage element to be discharged including fault messages upon termination.

Furthermore, provision is made for a current monitoring device in one embodiment, which measures the discharge current flowing during the discharge phases and evaluates it on the basis of predetermined criteria. Redundant monitoring of discharge parameters such as storage voltage, discharge current, load device temperature, switching device temperature are thus possible. Moreover, these discharge parameters can be detected both in analog fashion and digitally. It is additionally possible that the switching device is directly influenced via the comparison devices, wherein the measured values are also forwarded to the control device, which, for its part, can perform a further turn-off or blocking.

An operating method for a safety discharge apparatus described above comprises the fact that the safety discharge apparatus, after the connection of an electrical storage element to be discharged, automatically or after manual initiation connects the electrical storage element to be discharged to the load device via the switching device driven in a clocked manner and discharges said electrical storage element. In doing so, time profiles of the storage voltage of the electrical storage element to be discharged and of the temperature of the load device are detected and a clock ratio of the switching device driven in a clocked manner is set in a variable manner depending on the detected time profiles. Further, the discharge process is terminated upon detection of not discharge-typical time profiles and the status of the discharge process of the safety discharge apparatus is indicated.

One embodiment of the operating method comprises activating the safety discharge apparatus by connecting an electrical storage element to be discharged, and measuring the storage voltage of the connected electrical storage element to be discharged by means of a voltage detection device. The method further comprises measuring the temperature of a load device, terminating the discharge process if the measured storage voltage or the measured temperature exceed previously defined values, and defining an initial clock ratio and thus an initial switched-on duration for a switching device. Still further, the method comprises starting a first discharge cycle by establishing a discharge current circuit via the load device by closing the switching device for the initial switched-on duration, interrupting the discharge current circuit by opening the switching device and measuring the storage voltage, and comparing this measured value with the previously measured storage voltage. Finally, the method concludes by terminating the discharge process if the measured storage voltage is not lower than the previously measured storage voltage at least by a predeterminable value, or starting a next discharge cycle after a dead time, defined via the initially defined clock ratio, if the measured storage voltage is less than the previously measured storage voltage.

When a next discharge cycle is started, it is possible to define a new switched-on duration, which is, in particular, longer than the initial switched-on duration, and also a new dead time, which is, in particular, shorter than the initial dead time, on the basis of the measured values of storage voltage and temperature. In the subsequent discharge cycles, once again a check is made to determine whether the measured storage voltage has fallen in comparison with the storage voltage measured in the preceding discharge cycle at least by a predetermined value. In addition, the clock ratio of switched-on duration and dead time can be continuously adapted on the basis of the measured values of storage voltage and temperature, in particular in order to achieve a shortest possible total duration of the discharge process, without overheating of the load device or of the switching device occurring.

A variable clock ratio depending on the storage voltage and the capacitance of the electrical storage element to be discharged, and also depending on the time profile of the discharge parameters, makes it possible to apply to the load device, which is formed e.g. with one or more resistors, a uniform loading close to the nominal loading capacity thereof. Consequently, it is possible to use the load device with a relatively small structural size for high voltages and large capacitances. By virtue of the fact that the maximum possible power is continuously dissipated in the load device, an optimum shortening of the total discharge duration is additionally achieved by comparison with the use of a continuous clock ratio.

The current supply of the safety discharge apparatus from the energy stored in the electrical storage element to be discharged makes a dedicated current supply of the safety discharge apparatus unnecessary.

A fuse and a bridge rectifier and additional arc protection (also with regard to isolation and surge arrester) of the protection device directly downstream of the input connections afford polarity reversal protection and flashover safety. As a result, polarity reversal of the DC voltage connections and connection of an AC voltage source are non-critical and do not lead to the destruction of the apparatus.

BRIEF DESCRIPTION OF THE DRAWINGS

The invention is explained in greater detail below on the basis of exemplary embodiments with the aid of figures, in which.

DETAILED DESCRIPTION

Figure 1:
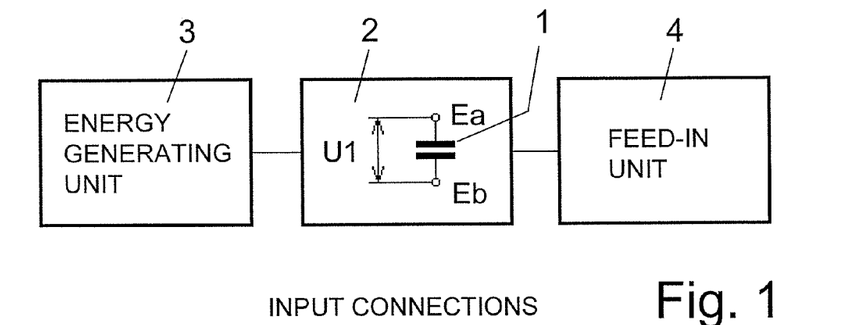
FIG. 1 shows a simplified schematic block illustration of an arrangement comprising an electrical storage element.

FIG. 1 shows a simplified schematic block illustration of an arrangement comprising an electrical storage element 1.

The arrangement illustrates in a simplified manner, by way of example, an energy generating and feed-in installation comprising an energy generating unit 3 connected to an intermediate circuit 2 and a feed-in unit 4 connected to an output of the intermediate circuit 2. The energy generating unit 3 is, for example, a photovoltaic installation having a high DC output voltage, which can be up to 1000 V, for example. In order to convert this DC voltage into an AC voltage for feeding into a grid, an inverter comprising the intermediate circuit 2 and the feed-in unit 4 is provided, by way of example. The electrical storage element 1 in the intermediate circuit 2 is at least one electrical capacitor having a capacitance of 5 mF, for example, and a storage voltage U1 of approximately 1000 V, for example, between the connections Ea and Eb. The electrical energy stored in the electrical storage element 1 can thus be in the range of up to one watt-hour. In the event of repair and/or maintenance interventions, this electrical storage element 1 may still be charged with this energy and, therefore, has to be discharged for safety reasons prior to the intervention. In the case of a discharge via a directly connected load resistor having a value of a few hundred ohms, said resistor would be loaded with power of a few kilowatts for a short time and would have to be designed with an appropriate size.

Figure 2:
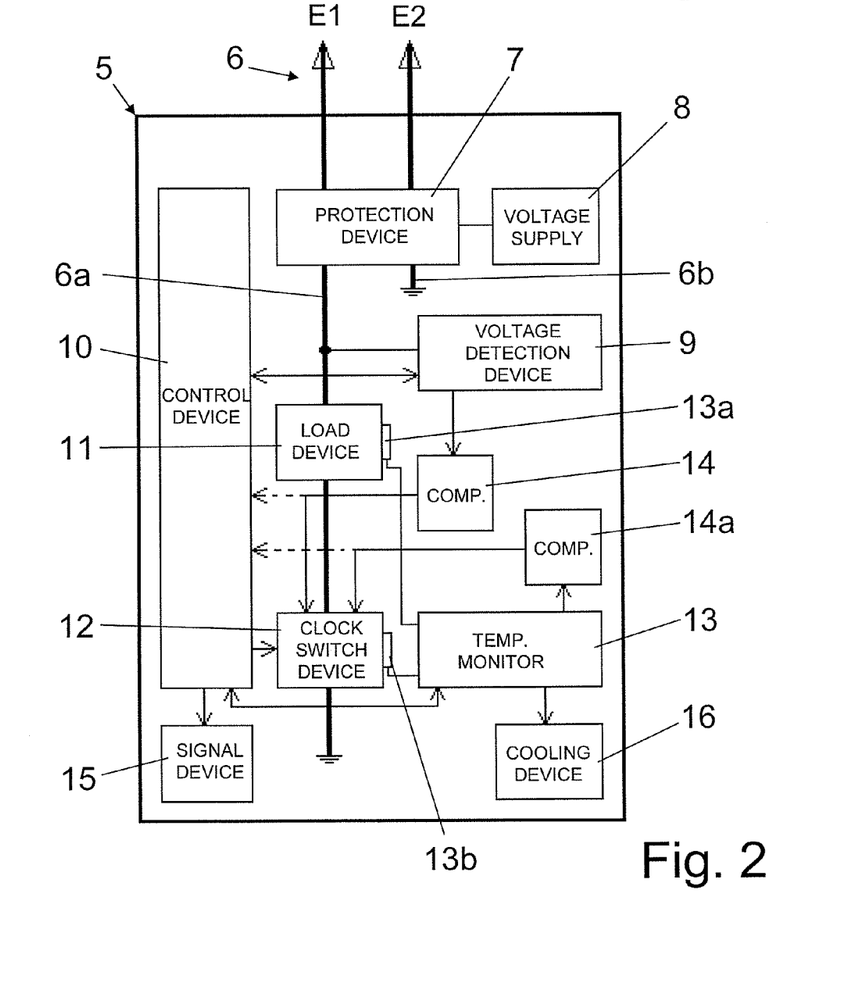
FIG. 2 shows a schematic block illustration of a safety discharge apparatus according to the invention.

A safety discharge apparatus 5 shown in a schematic block illustration in FIG. 2 serves for discharging such electrical storage elements 1.

The term "discharge parameter" used in the following text encompasses a storage voltage U1 and a capacitance of the electrical storage element 1, a discharge current, and temperatures of devices through which the discharge current flows.

A basic construction of the safety discharge apparatus 5 substantially comprises input connections E1, E2, a load device 11 and a clocked switching device 12. By means of the input connections E1, E2, an electrical storage element 1 to be discharged is connected to the safety discharge apparatus 5. The load device 11 is then connected to the two input connections E1, E2 via the switching device 12. A clocked switching-on and switching-off of the switching device 12 with a variable clock ratio allows a fast discharge by means of a maximum permissible loading of the load device 11.

The safety discharge apparatus 5 comprises two connection lines 6 with input connections E1, E2, a protection device 7, a voltage supply device 8, a voltage detection device 9, a control device 10, a load device 11, a switching device 12, a temperature monitoring device 13, comparison devices 14, 14a and a signalling device 15. The safety discharge apparatus 5 can additionally have a cooling device 16.

The input connections E1, E2 which are to be connected to the connections Ea, Eb of the electrical storage element 1 to be discharged are connected to the protection device 7. The protection device 7 is arranged directly downstream of the input connections E1, E2 and serves as polarity reversal protection and arc protection. Therefore, it is not necessary to heed the polarity of the electrical storage element 1. Connection to an AC voltage is therefore non-critical as well.

The voltage supply device 8 is connected to the protection device 7, and serves for the electrical supply of the individual functional devices of the safety discharge apparatus 5 and draws the respective operating energy thereof from the energy stored in the electrical storage element 1 to be discharged.

A positive line 6a runs from the protection device 7 to the load device 11, which, for its part, is connected to the switching device 12 and can be switched by means of the latter to earth with is sometimes referred to as ground, which is indicated by the earth symbol, and can thus be connected to the negative line 6b. Here and hereinafter, the polarity indicated here should be understood by way of example and can analogously also be constructed oppositely.

The voltage detection device 9 is connected to the positive line 6a for the purpose of detecting the voltage present thereon with respect to ground. Said voltage corresponds to the storage voltage U1 of the electrical storage element 1 if the latter is connected to the connection lines 6, if appropriately reduced by a specific voltage drop in the protection device 7, as will be described below. The voltage detection device 9 is connected to means for checking a temporal profile of the values of the storage voltage U1 which it measures. Said means can be arranged in it or in the control device 10, to which the present voltage value of the storage voltage U1 is transmitted. Furthermore, the control device 10 can also transmit signals to the voltage detection device 9 in order, for example, to activate further voltage measurements. As a result, it is possible, for example, to monitor the time profile of the storage voltage U1.

The voltage detection device 9 has a further connection to the comparison device 14, by means of which a signal can be generated which is obtained on the basis of a comparison of the storage voltage U1 detected by the voltage detection device 9 with a reference voltage in the comparison device 14. This signal, which can also be forwarded to the control device 10 (dashed line) or else can be generated in the latter itself, can be generated for example upon detection of "not discharge-typical" time profiles of the voltage measurement values and can be forwarded directly to the switching device 12 in order, in a safety situation (e.g. if the electrical storage element 1 is not disconnected from the energy generating unit 3), to immediately switch off said switching device or prevent it from being switched on. The voltage detection device 9 can be embodied in analog and/or digital fashion. Suitable A/D converters (not shown) can be used for digital parameter detection.

The control device 10 has a programmable, central computing unit, e.g. a microcontroller, and is connected to the switching device 12 for the control thereof. Moreover, the control device 10 is connected to the signalling device 15. The function of the control device 10 will be explained in greater detail further below.

The load device 11 is, for example, an ohmic resistor via which the electrical storage element 1 connected to the safety discharge apparatus 5 is discharged if the switching device 12 is switched on and connects the negative line 6b to the load device 11. The switching device 12 is switched on and off permanently or in a clocked manner by means of the control device 10. This will be explained thoroughly further below.

In this example, the load device 11 and the switching device 12 are in thermal contact with respectively at least one temperature sensor 13a and 13b. The temperature sensors 13a and 13b are connected to the temperature monitoring device 13, which is designed for analog and/or digital temperature monitoring. Here, too, it is possible to use suitable A/D converters (not shown) for digital parameter detection. The temperature monitoring device 13 is directly connected to the control device 10. By means of the comparison device 14a, temperature values detected by the temperature monitoring 13 by means of the temperature sensors 13a, 13b are compared with reference values, e.g. in the form of reference voltages, and a binary comparison signal is generated. This signal, too, which can likewise be forwarded to the control device 10 (dashed line) or else can be generated in the latter itself, can be generated for example upon the detection of an "overtemperature" of the load device 11 and be directly forwarded to the switching device 12 in order, in a safety situation (e.g. if the load device 11 and/or the switching device 12 heat(s) up too rapidly within a time segment), to immediately switch off said switching device 12 or to prevent it from being switched on. The control device 10 can also control the temperature monitoring device 13 in such a way that specific temperature monitorings are performed at specific times and/or over specific time periods.

The signalling device 15 serves to indicate the status of the discharge process carried out by means of the safety discharge apparatus 5 with the electrical storage element 1 connected. Thus, by way of example, the storage voltage itself and/or one or more of the states "discharge is proceeding", "discharge (successfully) ended", "not dischargeable", "overheating", "overvoltage" are indicated to the user optically by means of corresponding indicators, luminaires, displays. In the case of some states such as in the case of overheating, for example, it is also possible to provide an additional acoustic warning signal or, by way of example, in the case of a successfully ended discharge, a haptic signal, in particular a vibration signal. The signalling device 15 will be described in greater detail below.

In one embodiment, the cooling device 16 comprises cooling ribs which are thermally conductively connected to the heat-generating devices (load device 11, switching device 12, also protection device 7) and emit the heat to the surrounding air. It is also possible for the cooling device 16 additionally to have a fan that generates a forced convection for cooling the heat-generating components, in particular the load device and the switching device 12, and/or the safety discharge apparatus 5 overall. By way of example, additional Peltier elements are also conceivable.

The assemblies of the safety discharge apparatus 5 that require electrical energy for operation obtain this energy via the voltage supply device 8, which, in turn, is supplied from the energy stored in the electrical storage element 1 to be discharged, and therefore also contribute to a faster discharge process thereof. Of course, in an alternative embodiment, it is also possible to provide a dedicated energy supply, e.g. from a battery or a power supply unit.

The safety discharge apparatus 5 can be realized in one embodiment as a handheld unit, wherein the input connections E1, E2 are configured differently depending on the connections Ea and Eb of the electrical storage element 1 to be discharged, for example as clamping connections or as simple contact pins or tips.

The input connections E1, E2 are insulated in accordance with the high storage voltages U1 such that no hazards as a result of flashovers arise upon connection.

Figure 3:
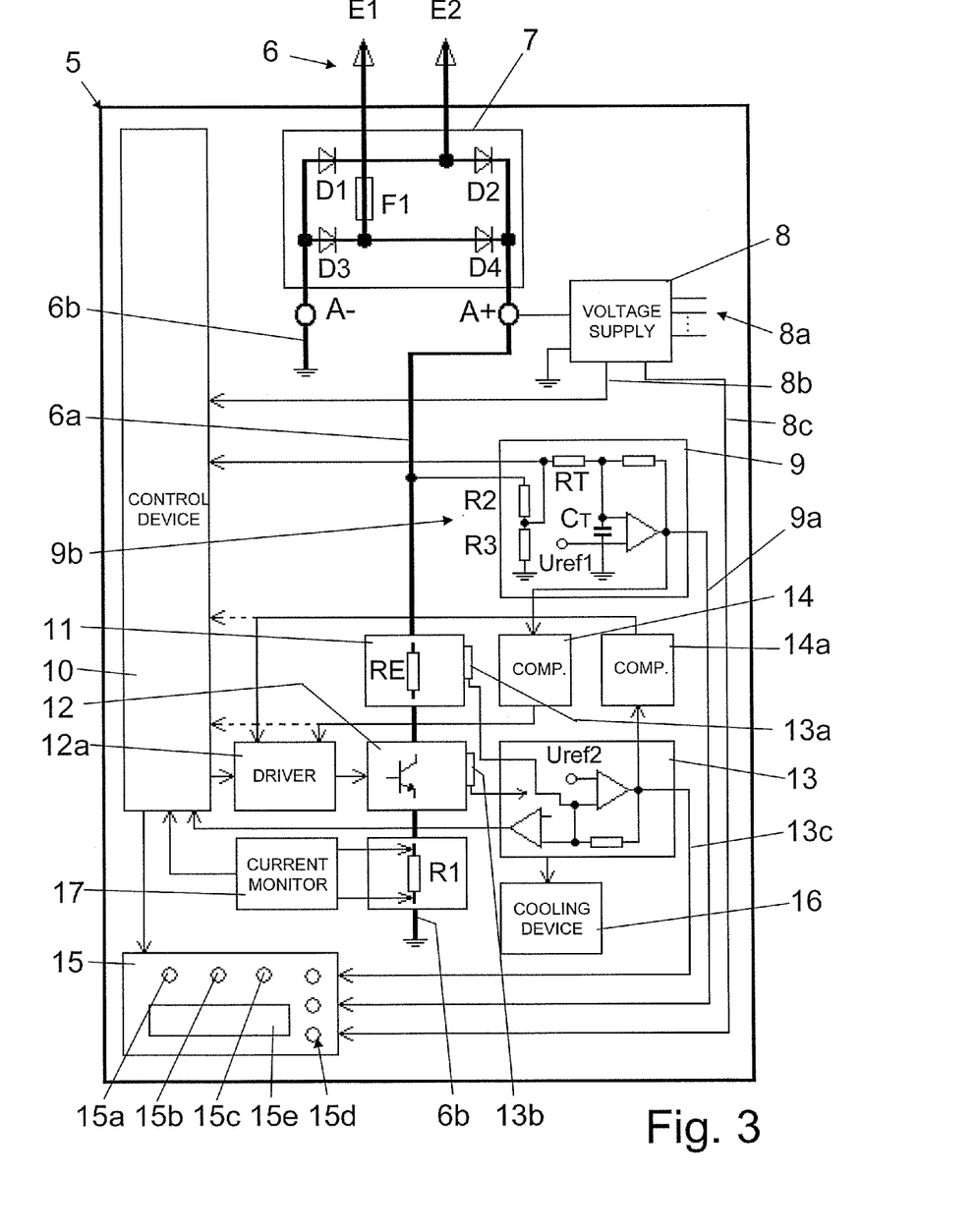
FIG. 3 shows a block diagram of an exemplary embodiment of the safety discharge apparatus according to the invention in accordance with FIG. 2.

FIG. 3 shows a block diagram of one embodiment of the safety discharge apparatus 5 according to the invention in accordance with FIG. 2.

The protection device 7 in one embodiment has four rectifier diodes D1 . . . D4 each having a high reverse voltage and a high forward current, which are arranged as a bridge rectifier circuit and form a polarity reversal protection in such a way that the connection lines 6 connected to the bridge rectifier circuit can be connected to the electrical storage element 1 to be discharged, independently of a polarity of the latter. The input connection E1 is safeguarded by means of a fusible link F1. It goes without saying that further fuse elements can be arranged, in particular also functional groups for arc protection, which are not illustrated here. The voltage drop through the diodes D1 . . . D4 is taken into account in the voltage measurement by the voltage detection device 9. The positive line 6a is connected to an internal connection A+ of the protection device 7, wherein the negative line 6b is connected to an internal connection A− of the protection device 7. An opposite polarity is likewise possible analogously here and hereinafter.

The positive line 6a is connected to the load device 11, which here has at least one load resistor RE arranged in a manner thermally conductively connected to the first temperature sensor 13a. It is also possible to arrange a plurality of load resistors RE for example in a parallel circuit.

The switching device 12 is equipped here with a switching element, which is, for example, a semiconductor switch, for example at least one power IGBT and/or MOSFET type. A driver 12a is arranged between the switching device 12 and the control device 10, said driver being adapted to the switching element of the switching device 12. The driver 12a is driven in a clocked manner by the control device 10. In this case, by way of example, a programmed dynamic mark-space ratio (clock ratio, see FIG. 4), which will be described in greater detail below, is generated by a pulse pattern generation within the control device 10. This can be realized e.g. by suitable software programming of the microcontroller of the control device 10.

Between the switching device 12 and the ground connection to the negative line 6b, a current measuring resistor R1 is arranged in series with the switching device 12, and is connected to a current monitoring device 17 for detecting the parameter "discharge current". The current monitoring device 17 can be embodied as an independent circuit or else as part of the control device 10. As an alternative to the current measuring resistor R1, the means such as, for example, Hall probes or current measuring coils can also be used for the purpose of current measurement.

The signalling device 15 here has at least three luminous indicators 15a . . . d and a display 15e. The luminous indicators 15a . . . d serve for status indication, wherein, by way of example, the luminous indicator 15a shows green continuous or flashing light during a normal discharge process and no longer emits light or flashes after discharge has been carried out successfully. The luminous indicator 15b, for example, shows red continuous or flashing light if termination is effected on account of "not discharge-typical" measured values (will be described in even further detail below) and dangerous storage voltages are still present, for example those greater than 120 V. A yellow luminous indicator 15b lights up if the discharge is interrupted owing to the internal maximum temperature being exceeded. These indications are additionally present in redundant fashion by means of the luminous indicators 15d, wherein the latter are switched on directly, as will also be described below. Moreover, in the case of hazard indications, acoustic indicators and/or vibration devices can also acoustically and/or haptically warn and/or inform the operator. The display 15e can, using symbolism and/or text, indicate the present storage voltage, describe and explain the respective indication and indicate faults more precisely, and also give indications concerning fault rectification and/or operational control. For this purpose, the signalling device 15 can have an independent microcontroller.

For detecting and monitoring the parameters storage voltage U1 and various temperatures, use is made of the voltage detection device 9 and the temperature monitoring device 13 in addition to the current monitoring device 17.

The voltage supply device 8 is connected to the internal connection A+ of the protection device 7 and ground and generates operating voltages on supply lines 8a for the individual functional groups of the safety discharge apparatus 5. Via a first optional signal line 8b, the voltage supply device 8 transmits a signal to the control device 10 if a discharge state of the connected electrical storage element 1 to be discharged is ascertained. This signal "discharge state" can be used in the control device 10 for example for shutting down a running program on its microcontroller in order to end this correctly. A second optional signal line 8c connects the voltage supply device 8 to the signalling device 15 and can signal in it directly an indication "discharge state" to the operator by switching on a corresponding luminaire.

In this exemplary embodiment, the voltage detection device 9 is equipped with a voltage divider 9b, the voltage divider resistors R2, R3 of which are connected in series between the positive line 6a and the reference potential A− or the negative line 6b. Their common connection is connected to the control device 10 via a line, as a result of which the control device 10 can detect the voltage that arises in the voltage divider 9b directly using suitable means. At the same time, said line is connected via a low-pass filter resistor RT to a low-pass filter capacitor CT, which is connected to an operational amplifier. Moreover, said operational amplifier is connected to a reference voltage Uref1. In order to prevent an overload of the safety discharge apparatus 5 by an inadvertently switched-on energy generating unit 3 (e.g. a stabilizer or a solar generator—also see FIG. 1), the voltage tapped off at the common connection point of the voltage divider resistors R2, R3, the magnitude of said voltage being directly dependent on the storage voltage U1 of the electrical storage element 1 to be discharged, is conducted to the low-pass filter capacitor CT, the latter being charged by said voltage. The operational amplifier compares this voltage of the low-pass filter capacitor CT with the reference voltage Uref1. If the voltage of the low-pass filter capacitor CT attains the magnitude of the reference voltage Uref1 within a specific time, then a comparator of the comparison device 14 is switched over and a stop signal is generated, which interrupts the driving present from the control device 10 at the driver 12a of the switching device 12 and thus prevents an overloading of the load device 11. Since, with the energy generating unit 3 switched on or still connected, the low-pass filter capacitor CT is charged to a value proportional to the voltage of the connected energy generating unit 3, while said value cannot be reached in the case of a normal discharge process of the electrical storage element 1 precisely owing to the discharge, an identification of a switched-on energy generating unit 1 is thus possible. If, by way of example, during a discharge process of the electrical storage element 1 with a voltage of 800 V, for example, the energy generating unit 1 were not turned off and/or disconnected from the electrical storage element 1, then the voltage of the low-pass filter capacitor CT would reach a voltage proportional to 800 V depending on the voltage dividing ratio and the discharge process would be terminated e.g. after three seconds and a red signalling luminaire 15d in the signalling device 15 would simultaneously be switched on via the signal line 9a, which signals this fault to the user and also identifies it by means of inscription or other indications (e.g. on a display 15e).

The temperature monitoring device 13 has already been explained above in connection with FIG. 2. In the exemplary embodiment shown in FIG. 3, here two operational amplifiers are identified in the temperature monitoring device 13, one of which operational amplifiers can be connected to the temperature sensors 13a and 13b via a switch (not described in greater detail). Here it is connected to the temperature sensor 13a and transmits the temperature value detected by the temperature sensor 13a to the control device 10. The other operational amplifier compares the temperature value with a reference voltage Uref2 and is firstly connected to the signalling device 15 via a signal line 13c, wherein, in the case of an overtemperature, an associated signalling luminaire 15d in the signalling device 15 is driven for the purpose of signalling said overtemperature via the signal line 13c. Secondly, the output of said operational amplifier is also connected to the input of the comparison device 14a. If an overtemperature occurs, then a comparator of the comparison device 14a connected to the driver 12 is switched over and a stop signal is generated, which interrupts the driving present from the control device 10 at the driver 12a of the switching device 12 and thus prevents an overloading of the load device 11. For the second temperature sensor 13b, a further, identical or similar circuit construction can also be provided, which is not illustrated here.

A clock generator circuit (not illustrated) having a variable clock ratio can be integrated for example in the driver 12a and/or the control device 10. It is also possible to arrange a separate clock generator circuit which interacts with the driver 12a and the control circuit 10.

Figure 4:
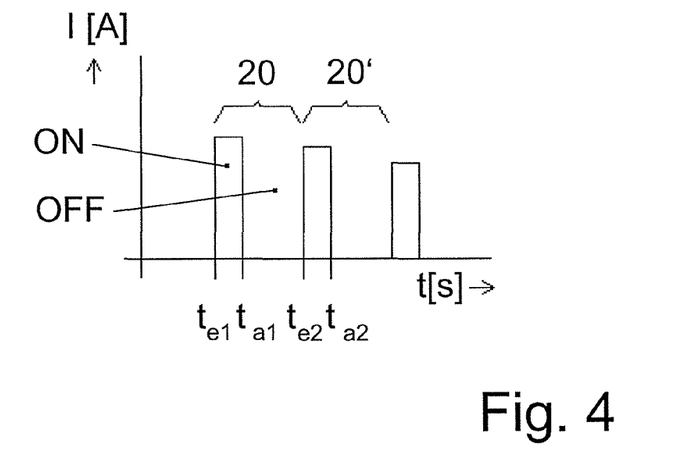
FIG. 4 shows a simplified graphical illustration for elucidating discharge cycles.

FIG. 4 shows a simplified graphical illustration of the time profile of the switching states of the switching device 12 during a discharge process for elucidating discharge cycles and also the clock ratio, which is also called duty cycle ratio or on-off ratio. In this case, the discharge current I flowing through the switching device 12 is plotted against the time t. The discharge process has at least one discharge cycle 20. A discharge cycle 20 consists of a first time segment ON from an instant te1 to an instant ta1 and of a second time segment OFF from the instant ta1 to an instant te2, at which a new discharge cycle 20 begins. A switched-on switching device 12 identifies the respective first time segment ON of a discharge cycle 20, as a result of which the discharge current circuit composed of storage element 1, switching device 12 and load device 11 is closed and the discharge current I therefore flows via the load device 11 and the connected electrical storage element 1 is discharged (also see FIG. 3); during the respective second time segment OFF of a discharge cycle, the switching device 12 is switched off, that is to say that no discharge current flows. In the first time segment of the second discharge cycle 20' between the instants te2 and ta2, in the case of a correctly proceeding discharge process, the discharge current I should be slightly smaller (this is illustrated more than proportionally in FIG. 4) than in the first time segment of the first discharge cycle, since the storage voltage should have fallen as a result of the discharge in the first cycle and a dischargeability of the storage element 1 can thus be ascertained. If this is not the case, i.e. if the discharge current in the second cycle is just as high as in the first cycle, this is suggestive of the continuing existence of an energy feed into the storage element 1, e.g. from the energy generating unit 3 still connected.

The clock ratio is defined as follows:

$$\text{Clock ratio} = \text{ON/OFF} = (ta1-te1)/(te2-ta1) \quad (1)$$

This clock ratio can be designed in a variable manner depending on a nominal system voltage, here the present storage voltage U1, and the capacitance to be discharged of the electrical storage element 1. This is done by the above-described clock generator by means of the control device 10.

The clock ratio can be adapted in one embodiment depending on the time profile of the discharge parameters. In particular, with a falling storage voltage U1, the proportion of the time segment ON can be increased, that is to say that the clock ratio can be increased, since the power converted per unit time in the load resistor RE decreases with the storage voltage. As a result, a uniform loading of the load resistor RE close to its nominal loading capacity is achieved and the total discharge duration is optimally shortened by comparison with the use of a continuous clock ratio by virtue of the fact that the maximum permissible power is continuously dissipated in the load resistor RE.

The greater the proportion of the time segment OFF (also called dead time proportion) in the clock ratio, the smaller the extent to which the load resistor RE of the load device is loaded by the discharge, since the proportion of the time segment ON is correspondingly smaller. The lower this loading of the load resistor RE, the higher the dischargeable capacitance of the electrical storage element 1 to be discharged can be. In this way, the load resistor RE, with a relatively small structural size, can also be used for high voltages and large capacitances to be discharged.

Figure 5:
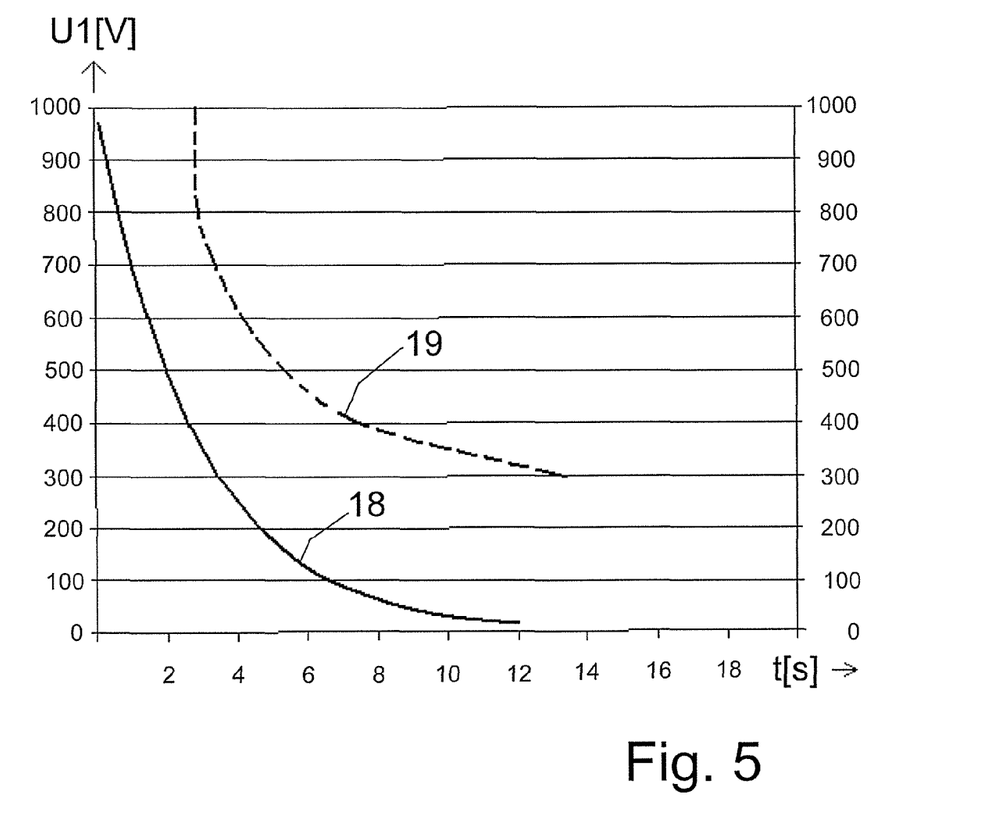
FIG. 5 shows a graphical illustration of a discharge curve.

An exemplary discharge curve 18 is thus achieved during a discharge process of the electrical storage element 1, said discharge curve being plotted as a storage voltage U1 in volts against a time t in FIG. 5. Proceeding from an initial voltage of 1000 V, the discharge process has ended after approximately 12 s, a safe storage voltage of approximately less than 10 V being attained. The reference symbol 19 indicates a time-dependent limit value for the storage voltage, which, taking account of the voltage dividing ratio used, can be converted into a dynamically adaptable reference voltage Uref for the comparison device 14.

Figure 6:
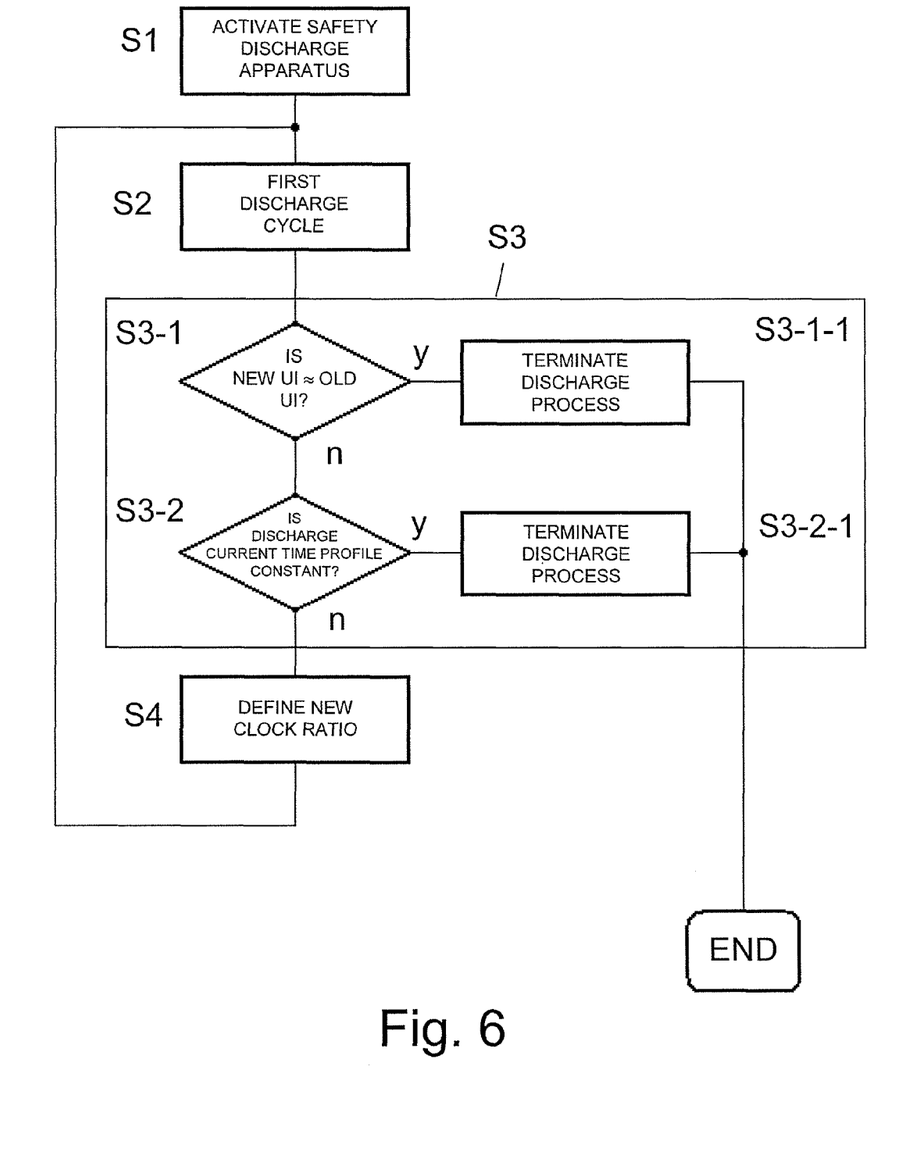
FIG. 6 shows an exemplary flowchart of an operating method according to the invention.

In association with FIG. 6, which shows an exemplary flowchart of an operating method according to the invention for the safety discharge apparatus 5, the function of the safety discharge apparatus 5 in accordance with the exemplary embodiment according to FIG. 3 will now be described.

The safety discharge apparatus 5 is connected by the input connections E1 and E2 to the connections Ea and Eb of the electrical storage element 1 to be discharged. This can be done in different, but safe, ways.

In a first method step S1, the safety discharge apparatus 5 is activated by power being drawn from the electrical energy stored in the electrical storage element 1 by means of the voltage supply device 8, wherein, via the signal line 8b, a start-up process is effected by means of a reset of the microcontroller of the control device 10. In the same method step S1, an initial measurement of the properties of the connected electrical storage element 1, in particular a measurement of the storage voltage U1, is effected by means of the voltage detection device 9. If the storage voltage U1 is excessively high, e.g. higher than permissible for the safety discharge apparatus 5, the discharge process is terminated and the reason for this is indicated by the signalling device 15. If the measured value of the storage voltage U1 lies in the range which is defined for a discharged electrical storage element 1, then the process is likewise terminated with the indication that an electrical storage element 1 that has already been discharged is present.

In parallel, a measurement of the temperature of the load device 11 and of the switching device 12 is carried out in method step S1. If an overtemperature is ascertained during the temperature measurement, then the discharge process is terminated and the reason for this is indicated by the signalling device 15.

If all values determined for voltage and temperature lie in the permissible range, an initial clock ratio for the switching device 12 is defined, wherein the duration of a discharge cycle 20 is, for example, in the μs to ms range, for example in the range of 0.5 . . . 5 ms, wherein the proportion of the time segment ON is preferably in the range of a few percent of the duration of a discharge cycle.

A second method step S2 involves running through a first time segment ON of a first discharge cycle 20 (cf. FIG. 4) with the establishment and reinterruption of a discharge current circuit via the load device 11 by the closing and opening of the switching device 12 with a switched-on duration resulting from the initial clock ratio defined. A measurement of the discharge current I can also additionally be performed by means of the current monitoring device 17. This is not shown, but can readily be imagined.

In a further method step S3-1, which in one embodiment is carried out in the time segment with the switching device 12 having been opened, the storage voltage U1 is measured and this measured value is compared with the storage voltage U1 measured in method step S1. If the presently measured storage voltage U1 is substantially equal to the previously measured storage voltage U1 (y), i.e. the electrical storage element was not significantly discharged despite a discharge current through the load device 11, then the discharge process is terminated (S3-1-1) and the reason is indicated by the signalling device 15.

If the presently measured storage voltage U1 is less than the previously measured storage voltage U1 by a predeterminable magnitude (n), i.e. a dischargeability of the storage element 1 exists, then a next discharge cycle 20 is defined and a next method step S3-2 is carried out.

Method step S3-2 involves comparing the discharge current values measured in step S2 with those from the preceding discharge cycle 20 (which is naturally expedient only after the second ON phase, cf. FIG. 4 again). If a time profile of the measured discharge current has remained constant (y), the discharge process is terminated (S3-2-1) and the reason is indicated by the signalling device 15. If the time profile of the measured discharge current is decreasing (n), i.e. a dischargeability of the storage element 1 exists, then the next discharge cycle 20 is likewise enabled and method step S4 is carried out.

Method step S4 involves defining a new clock ratio in accordance with the measured values of storage voltage (or discharge current) and, if appropriate, the temperature. In the case of an overtemperature, it is possible here also to insert a pause having a predeterminable duration in order to give the load device 11 and/or the switching device 12 an opportunity to cool down. The method then jumps to method step S2 and this process is carried out until the storage value falls below a value regarded as discharged or safe.

This is then carried out in method steps S3 by terminating the discharge process with the indication "discharge state".

The temperature measurement is continuously updated in parallel with the method steps illustrated, such that the discharge process can be interrupted as soon as a permissible maximum temperature of the load device 11 is exceeded. This can then be indicated by the signalling device 15 and the discharge process can be continued automatically or else manually if the temperature has fallen into a non-critical range and this is indicated by the signalling device 15.

The measurements particularly of the storage voltage U1 that have been described here as method steps at discrete points in time can also be carried out continuously in order to obtain a more precise picture of the time profiles of the discharge process.

In an alternative embodiment, a discharge cycle can also consist of a plurality of partial discharge cycles, i.e. method step S2 can comprise a number of the discharge cycles 20 illustrated in FIG. 4, wherein the clock ratio of the partial discharge cycles can be made constant or variable. In this case, method step S3 can be carried out during a pause in the discharge process between two discharge cycles consisting of partial discharge cycles during which the clocking is interrupted.

The safety discharge apparatus 5 is constructed in a housing e.g. as a handheld unit. In this case, by way of example, one input connection E1 can be embodied in the manner of an exchangeable high-voltage test tip and the other input connection E2 can be embodied as a high-voltage clamping connection. It goes without saying that other embodiments are possible.

The invention is not restricted to the exemplary embodiments described above, but rather can be modified within the scope of the appended claims.

It is thus conceivable, for example, for the voltage supply device 8 to be equipped with a dedicated energy source, e.g. a rechargeable battery or a grid connection.

The measured values and their temporal profiles of discharge processes can be stored in a storage device (not shown) of the control device 10 and evaluated. It is thereby possible, for example, to determine the capacitance of the connected electrical storage element 1. A transmission of these measured values and results can be effected by means of a line or wirelessly for further evaluation, e.g. in a computer (laptop), and/or be indicated in a display.

The invention claimed is:

1. A safety discharge apparatus for an electrical storage element, comprising
   a load device configured to discharge the electrical storage element, and further configured to connect to the electrical storage element via input connections;
   a clocked switching device connected to a control device and configured to produce and interrupt a discharge current associated with the electrical storage element when connected thereto in response to a control signal from the control device;
   a voltage detection device configured to detect a storage voltage of the electrical storage element, and
   a discharge condition monitor device operably coupled to the voltage detection device and configured to evaluate a dischargeability of the electrical storage element by evaluating a magnitude and direction of change in a characteristic of the electrical storage element and output an indication signal based thereon,
   wherein the control device is configured to selectively adjust the control signal based on the indication signal.

2. The safety discharge apparatus according to claim 1, further comprising at least one signalling device configured to indicate a status of the safety discharge apparatus.

3. The safety discharge apparatus according to claim 1, further comprising a protection device arranged between the input connections and the load device, and configured to provide a polarity reversal protection or an arc protection, or both.

4. The safety discharge apparatus according to claim 1, wherein the discharge condition monitor comprises a low-pass filter capacitor and a comparison device configured to compare a voltage of the low-pass filter capacitor with a reference voltage.

5. The safety discharge apparatus according to claim 1, further comprising a temperature monitoring device configured to monitor a temperature of the load device.

6. The safety discharge apparatus according to claim 5, wherein the temperature monitoring device is further configured to monitor a temperature of the switching device.

7. The safety discharge apparatus according to claim 5, wherein the temperature monitoring device is connected via a comparison device to the clocked switching device, and configured to switch off the clocked switching device at a predetermined overtemperature.

8. The safety discharge apparatus according to claim 1, further comprising a voltage supply device configured to supply the safety discharge apparatus with electrical energy from the electrical energy stored in the electrical storage element.

9. The safety discharge apparatus according to claim 1, wherein the load device or the switching device, or both, further comprise a cooling device.

10. The safety discharge apparatus according to claim 2, wherein the signalling device is further configured to indicate a charge state of the electrical storage element when the electrical storage element is connected to the safety discharge apparatus.

11. The safety discharge apparatus according to claim 1, further comprising a current monitoring device configured to monitor a current associated with the clocked switching device.

12. An operating method for a safety discharge apparatus comprising a load device and a switching device, and configured to couple to an electrical storage element for a discharge thereof, comprising:
   producing and interrupting a discharge current from the electrical storage element when coupled thereto via the load device and the switching device in a clocked manner according to a clock ratio;
   varying the clock ratio in producing and interrupting the discharge current based on a time profile of a storage voltage associated with the electrical storage element when coupled thereto; and
   evaluating a state associated with the electrical storage element that characterizes a dischargeability thereof, and performing or continuing a performing of the method only when the evaluated state indicates the electrical storage element is dischargeable.

13. The operating method according to claim 12, further comprising detecting a temperature of the load device or the switching device during a time period associated with the producing and interrupting the discharge current.

14. The operating method according to claim 13, further comprising interrupting the discharge process if the temperature of the load device or the switching device exceeds predetermined limit values.

15. The operating method according to claim 12, further comprising activating the safety discharge apparatus by connection of the electrical storage element to be discharged to the safety discharge apparatus.

16. The operating method according to claim 12, further comprising measuring a discharge current.

17. The operating method according to claim 16, wherein a dischargeability of the storage element defined by the state is ascertained on the basis of a time profile of the measured discharge current.

18. The operating method according to claim 12, further comprising signalling a status of the discharge process of the safety discharge apparatus is signalled by a signalling device or a communication interface.

19. The operating method according to claim 18, wherein a status of the discharge process is signalled optically, acoustically, or haptically, or a combination thereof.

20. The operating method according to claim 12, wherein, before starting a subsequent discharge cycle defined by producing and interrupting the discharge current following a previous discharge cycle, a new clock ratio is defined depending on the time profile of the measured values of the storage voltage.

21. The operating method according to claim 20, wherein the clock ratio of successive discharge cycles is increased.

22. The operating method according to claim 12, wherein a dischargeability of the storage element defined by the state is ascertained on the basis of the time profile of the storage voltage.

23. The operating method according to claim 22, wherein a dischargeability of the storage element defined by the state is ascertained if the time profile of the storage voltage progresses below a predetermined reference profile.

24. The operating method according to claim 12, wherein a dischargeability of the storage element defined by the state is ascertained if the measured storage voltage in a discharge cycle defined by producing and interrupting the discharge current is less than the storage voltage measured in the preceding discharge cycle at least by a predetermined value.

* * * * *